United States Patent
Hiramatsu et al.

(10) Patent No.: US 10,636,919 B2
(45) Date of Patent: Apr. 28, 2020

(54) SOLAR CELL MANUFACTURING METHOD

(71) Applicant: Toshiba Mitsubishi-Electric Industrial Systems Corporation, Chuo-ku (JP)

(72) Inventors: Takahiro Hiramatsu, Tokyo (JP); Hiroyuki Orita, Tokyo (JP)

(73) Assignee: Toshiba Mitsubishi-Electric Industrial Systems Corporation, Chuo-ku (JP)

( * ) Notice: Subject to any disclaimer, the term of this patent is extended or adjusted under 35 U.S.C. 154(b) by 0 days.

(21) Appl. No.: 15/542,304

(22) PCT Filed: Mar. 9, 2015

(86) PCT No.: PCT/JP2015/056801
§ 371 (c)(1),
(2) Date: Jul. 7, 2017

(87) PCT Pub. No.: WO2016/143025
PCT Pub. Date: Sep. 15, 2016

(65) Prior Publication Data
US 2018/0269340 A1 Sep. 20, 2018

(51) Int. Cl.
*H01L 31/0216* (2014.01)
*H01L 31/068* (2012.01)
(Continued)

(52) U.S. Cl.
CPC .... *H01L 31/02161* (2013.01); *H01L 31/0216* (2013.01); *H01L 31/022425* (2013.01);
(Continued)

(58) Field of Classification Search
CPC ....... H01L 31/02161; H01L 31/022425; H01L 31/18; H01L 31/068; H01L 31/1868;
(Continued)

(56) References Cited

U.S. PATENT DOCUMENTS

| | | | | |
|---|---|---|---|---|
| 2008/0105161 A1* | 5/2008 | Asada | .................. | C09D 11/101 106/31.13 |
| 2009/0020158 A1* | 1/2009 | Ohtsuka | .............. | H01L 21/2254 136/261 |

(Continued)

FOREIGN PATENT DOCUMENTS

| | | |
|---|---|---|
| CN | 102933496 A | 2/2013 |
| TW | 201503401 A | 1/2015 |

(Continued)

OTHER PUBLICATIONS

Office Action dated May 29, 2018 in Korean Patent Application No. 10-2017-7019187 (with unedited computer-generated English translation).

(Continued)

*Primary Examiner* — Michael Y Sun
(74) *Attorney, Agent, or Firm* — Oblon, McClelland, Maier & Neustadt, L.L.P.

(57) ABSTRACT

In the present invention, a p-type silicon substrate is produced, a solution containing aluminum is misted, and the misted solution is sprayed onto the back surface of the p-type silicon substrate under non-vacuum to form a back surface passivation film made of the aluminum oxide film on the back surface of the p-type silicon substrate. Thereafter, a light irradiation processing in which an interface between the p-type silicon substrate and the back surface passivation film is irradiated with ultraviolet light is performed.

9 Claims, 2 Drawing Sheets

(51) Int. Cl.
*H01L 31/18* (2006.01)
*H01L 31/0224* (2006.01)
*H01L 21/67* (2006.01)
*H01L 21/768* (2006.01)
*H01L 27/12* (2006.01)
*H01L 21/02* (2006.01)
*H01L 21/324* (2006.01)
*H01L 31/20* (2006.01)
*H01L 39/24* (2006.01)
*H01L 33/44* (2010.01)
*H01L 33/00* (2010.01)
*H01L 21/28* (2006.01)
*H01L 23/31* (2006.01)
*H01L 21/3065* (2006.01)

(52) U.S. Cl.
CPC ............ *H01L 31/068* (2013.01); *H01L 31/18* (2013.01); *H01L 21/02694* (2013.01); *H01L 21/28247* (2013.01); *H01L 21/30655* (2013.01); *H01L 21/324* (2013.01); *H01L 21/6708* (2013.01); *H01L 21/67051* (2013.01); *H01L 21/76825* (2013.01); *H01L 21/76862* (2013.01); *H01L 23/3171* (2013.01); *H01L 27/1285* (2013.01); *H01L 31/186* (2013.01); *H01L 31/1864* (2013.01); *H01L 31/1868* (2013.01); *H01L 31/208* (2013.01); *H01L 33/0095* (2013.01); *H01L 33/44* (2013.01); *H01L 39/247* (2013.01); *H01L 2224/80048* (2013.01); *Y02E 10/547* (2013.01)

(58) Field of Classification Search
CPC . H01L 31/0216; H01L 31/028; H01L 39/247; H01L 33/44; H01L 33/0095; H01L 21/28247; H01L 23/3171; H01L 21/30655; H01L 21/02694; H01L 31/186; H01L 21/324; H01L 2224/80048; H01L 31/1864; H01L 31/208; H01L 21/6708; H01L 21/76862; H01L 27/1285; H01L 21/67051; H01L 21/76825; Y02E 10/547; Y02P 70/521

See application file for complete search history.

(56) References Cited

U.S. PATENT DOCUMENTS

| | | | | |
|---|---|---|---|---|
| 2011/0241549 | A1* | 10/2011 | Wootton | F21S 8/006 315/117 |
| 2013/0101867 | A1* | 4/2013 | Yukinobu | C03C 17/006 428/702 |
| 2014/0373904 | A1* | 12/2014 | Choi | H01B 1/16 136/252 |
| 2016/0204301 | A1* | 7/2016 | Hiramatsu | H01L 31/028 438/57 |

FOREIGN PATENT DOCUMENTS

| | | | |
|---|---|---|---|
| WO | WO 2011/155635 A1 | 12/2011 | |
| WO | WO 2015/004767 A1 | 1/2015 | |
| WO | WO-2015004767 A1 * | 1/2015 | ........... H01L 31/028 |

OTHER PUBLICATIONS

Office Action dated Apr. 10, 2018 in Japanese Patent Application No. 2017-504450 (with English translation).
Office Action dated Aug. 3, 2018 in Korean Patent Application 10-2017-7019187 with unedited computer generated English translation.
International Preliminary Report on Patentability dated Sep. 21, 2017 in PCT/JP2015/056801 filed Mar. 9, 2015 (with English translation).
Combined Office Action and Search Report dated Jun. 28, 2018 in Chinese Patent Application No. 201580075408.8 (with computer-generated English translation).
International Search Report dated Apr. 7, 2015, in PCT/JP2015/056801 filed Mar. 9, 2015.
Taiwanese Office Action dated Jan. 12, 2017, in Taiwanese Application 104136463, with Partial English Translation.
Office Action dated Nov. 28, 2017 in Korean Patent Application No. 10-2017-7019187, and an English translation.
Office Action dated Dec. 7, 2018 in corresponding Chinese Patent Application No. 201580075408.8 (with English Translation), 9 pages.
Office Action dated Mar. 5, 2019 in the corresponding Chinese Application No. 201580075408.8 with English Translation.

* cited by examiner

F I G. 1
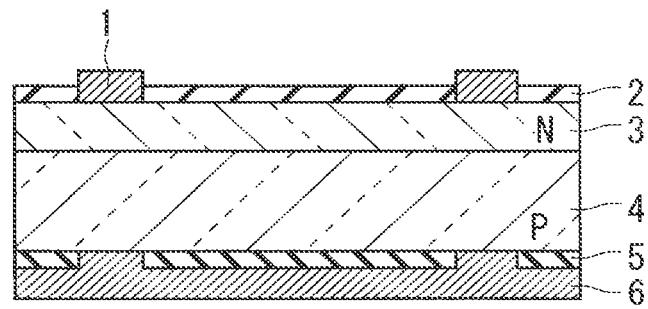
F I G. 2
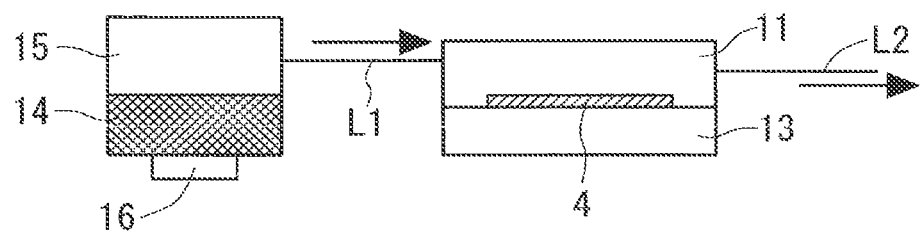
F I G. 3
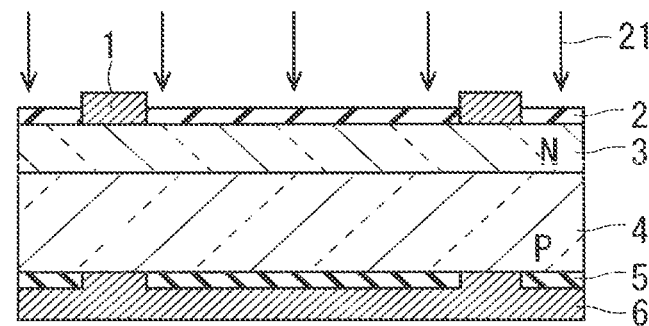

F I G. 4
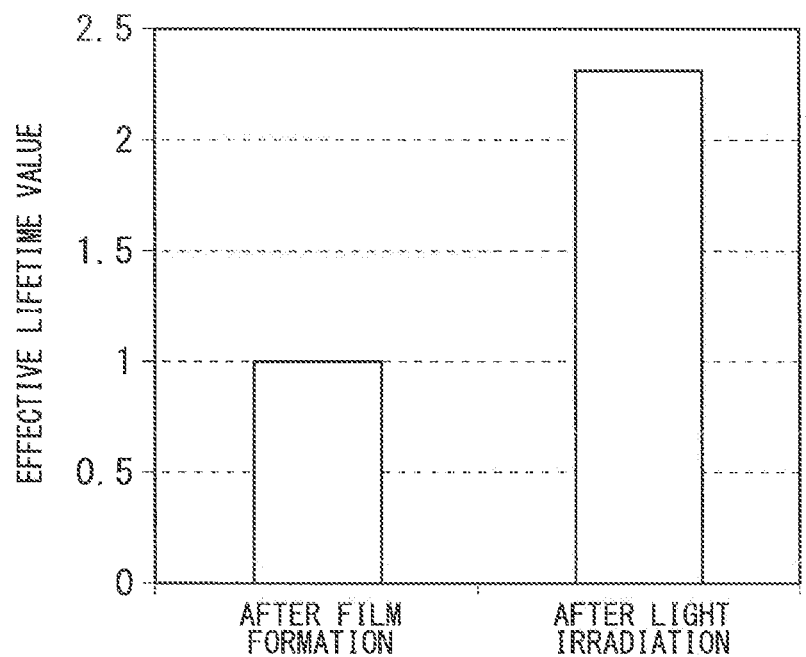
F I G. 5
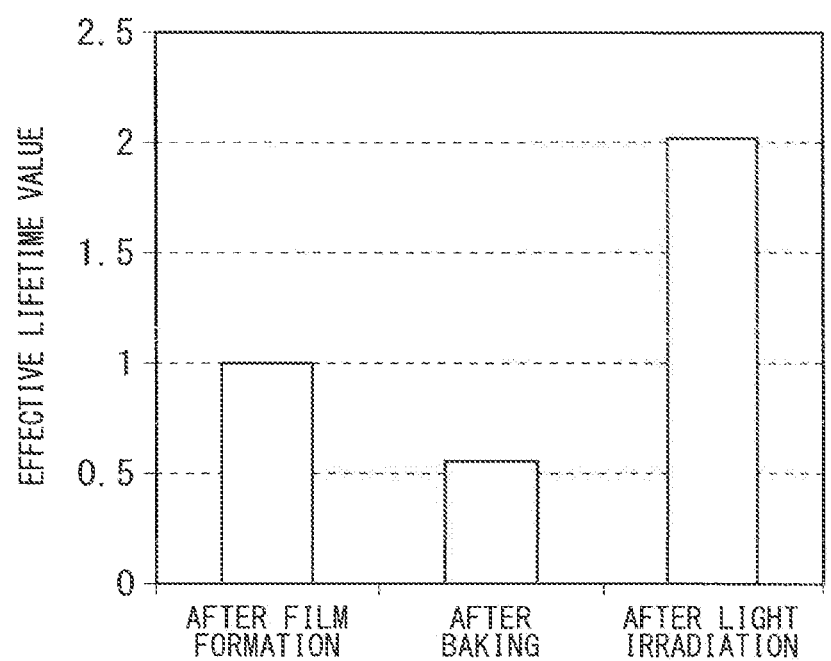

SOLAR CELL MANUFACTURING METHOD

TECHNICAL FIELD

The present invention relates to a method for manufacturing a solar cell, and more particularly, to a method for forming a passivation film on a silicon substrate.

BACKGROUND ART

In the field of a crystalline silicon solar cell, silicon substrates have been reduced in thickness in order to reduce the amount of silicon usage and to improve the conversion efficiency of silicon substrates. Unfortunately, thinner silicon substrates have remarkably lower conversion efficiency. The reason for this is, for example, that a large number of defects in the front surface of the silicon substrate having conductivity mainly cause the reduction in the lifetime of minority carriers (for example, electrons in a p-type substrate) generated by light irradiation. Thus, reducing the loss of minority carriers eventually improves the conversion efficiency of solar cells.

To regulate the reduction in the lifetime of carries, a passivation film is generally formed on the surface of a silicon substrate. An aluminum oxide film, one of a plurality of kinds of passivation films, has received attention because of its higher passivation effect (the function to regulate the reduction in lifetime) on the p-type silicon substrate.

The aluminum oxide films include negative fixed charges and are known to produce the passivation effect resulting from the field effect caused by the fixed charges. That is, when the passivation film made of the aluminum oxide film including negative fixed charges is formed on the front surface of the p-type silicon substrate the diffusion of electrons being minority carriers into the surface of the substrate can be regulated, resulting in prevention of the loss of carriers.

For example, Patent Document 1 discloses, as a method for manufacturing a solar cell, a method in which a misting method is employed as a method for forming the aluminum oxide film being the passivation film on the p-type silicon substrate. The manufacturing method achieves the effect of forming a passivation film, without inflicting damage to a silicon substrate, with a high degree of production efficiency at lower manufacturing cost by forming the passivation film by the misting method.

PRIOR ART DOCUMENTS

Patent Document

Patent Document 1: International Publication No. WO 2015/004767

SUMMARY OF INVENTION

Problems to be Solved by the Invention

However, when the passivation film is formed by the mist method, there has been a problem that film quality can be lower than that of the case in which the passivation film is formed by an ALD (Atomic Layer Deposition) method, a plasma CVD (Chemical Vapor Deposition) method or the like.

In the present invention, it is an object to solve a problem as described above and to provide a method for manufacturing a solar cell that allows for, without inflicting damage to a substrate, the formation of a passivation film of high film quality with a high degree of production efficiency at lower manufacturing cost.

Means for Solving the Problems

A method for manufacturing a solar cell in the present invention includes the steps of (a) producing a silicon substrate (4) having one main surface and the other main surface, (b) misting a solution (14) containing a metal clement, (c) spraying the misted solution onto one main surface of the silicon substrate under non-vacuum to form a passivation film (5) made of a metal oxide film on one main surface of the silicon substrate, (d) producing a solar cell structure using the silicon substrate having the passivation film formed thereon, and (e) performing a light irradiation processing in which an interface between the passivation film and the silicon substrate is irradiated with a given light (21).

Effects of the Invention

According to the method for manufacturing a solar cell in the present invention, a passivation film made of a metal oxide film is formed on one main surface of the silicon substrate by performing the steps (b) and (c), whereby a passivation film can be formed without inflicting damage to a silicon substrate, with a high degree of production efficiency at lower manufacturing cost.

Moreover, the present invention according to claim 1 allows for attaining a passivation film of high quality which improves a lifetime by the light irradiation processing according to the step (e).

These and other objects, features, aspects and advantages of the present invention will become more apparent from the following derailed description of the present invention when taken in conjunction with the accompanying drawings.

BRIEF DESCRIPTION OF DRAWINGS

FIG. 1 is a sectional view showing a solar cell structure manufactured in an embodiment.

FIG. 2 is an explanatory diagram showing a configuration of a film forming apparatus for implementing a film forming method of a passivation film in an embodiment.

FIG. 3 is a sectional view showing a situation of a light irradiation processing by ultraviolet light of the embodiment 1.

FIG. 4 is a graph showing the effect of a method for manufacturing a solar cell of the embodiment 1.

FIG. 5 is a graph showing the effect of a method for manufacturing a solar cell of the embodiment 2.

DESCRIPTION OF EMBODIMENTS (Solar Cell Structure)

FIG. 1 is a sectional view showing a solar cell structure manufactured by a method for manufacturing a solar cell according to the present embodiment (the embodiment 1, the embodiment 2).

As shown in FIG. 1, a silicon layer 3 (hereinafter referred to as "n-type silicon layer 3") of n-type conductivity is formed on the surface (the other main surface) of a silicon substrate 4 (hereinafter referred to as "p-type silicon substrate 4") of p-type conductivity. In addition, in FIG. 1, the solar cell is shown in a manner that the front surface of the p-type silicon substrate 4 is an upper surface and the back surface is a lower surface.

A front surface passivation film 2 being transparent is formed on the front surface of the n-type silicon layer 3. As the front surface passivation film 2, for example, a silicon oxide film, a silicon nitride film, an aluminum oxide film, or a laminated film including these films is conceivable. Then, a front surface electrode 1 penetrating through part of the front surface passivation film 2 is selectively formed on the front surface of the n-type silicon layer 3, whereby the front surface electrode 1 is electrically connected to the n-type silicon layer 3.

Moreover, a back surface passivation film 5 is formed on the back surface (one main surface) of the p-type silicon substrate 4. As the back surface passivation film 5, an aluminum oxide film, or a laminated film of an aluminum oxide film and a silicon. nitride film is employed. Further, a back surface electrode 6 penetrates part of the back surface passivation film 5 and is directly formed on the back surface of the p-type silicon substrate 4 and formed over the back surface of the back surface passivation film 5. Accordingly, the back surface electrode 6 is electrically connected to the p-type silicon substrate 4.

In the solar cell structure shown in FIG. 1, light incident from the front-surface-passivation-film-2 side reaches a p-n junction between the n-type silicon layer 3 and the p-type silicon substrate 4 to generate carriers, so that electricity is produced, and then, the produced electricity is extracted through the electrodes 1 and 6.

As described above, the passivation films 2 and 5 are formed in order to regulate the reduction in the lifetime of carriers. That is, a large number of defects (such as lattice defects) occur in the front surfaces of the n-type silicon layer 3 or the back surface of the p-type silicon substrate 4, and thus, minority carriers generated by light irradiation through the defects are recombined. Therefore, the front surface passivation film 2 and the back surface passivation film 5 arc formed on the front surface of the n-type silicon layer 3 and the back surface of the p-type silicon substrate 4, respectively, to regulate the recombination of carriers, whereby the lifetime of carriers can be improved.

The present invention pertains to an improvement of film quality of the back surface passivation film 5 formed on the back surface of the p-type silicon substrate 4. Hereinafter, the present invention will be described in detail based on the drawings illustrating the embodiments thereof.

<Embodiment 1>

FIG. 2 is an explanatory diagram showing a schematic configuration of a film forming apparatus for implementing a film forming method of a back surface passivation film 5 in the present embodiment (embodiment 1, embodiment 2).

As shown in FIG. 2, the film forming apparatus used in the film formation method of the present embodiment includes a reaction container 11, a heater 13 for heating the reaction container 11, a solution container 15 for containing a (material) solution 14, and a mist forming apparatus 16 for misting the solution 14 in the solution container 15.

In such a configuration, a solution 14 that has been misted by a mist forming apparatus 16 is sprayed onto the back surface of the p-type silicon substrate 4 in the reaction container 11 through a channel L1, whereby the back surface passivation film 5 made of the aluminum oxide film can be formed on the back surface of the p-type silicon substrate 4. In this case, the p-type silicon substrate 4 is placed on the heater 13 in the reaction container 11 in a manner that the back surface is an upper surface and the front surface is a lower surface.

That is, while the p-type silicon substrate 4 is placed on the heater 13, mist (the liquid solution 14 having a small particle diameter) is supplied into the reaction container 11 in the atmospheric pressure, and then, the back surface passivation film 5 is formed on the back surface of the p-type silicon substrate 4 as a result of a given reaction.

The heater 13 being, for example, a heating apparatus can heat the p-type silicon substrate 4 placed on the heater 13. In the formation of film the heater 13 is heated through an external controller not shown until the heater reaches a temperature required to form the back surface passivation film 5 composed of the aluminum oxide film.

The solution container 15 is filled with the solution 14 serving as a raw material solution for forming the back surface passivation film 5. The solution 14 contains aluminum (Al) elements as the metal source.

For example, an ultrasonic atomizing apparatus can be used as the mist forming apparatus 16. The mist forming apparatus 16 being the ultrasonic atomizing apparatus applies ultrasonic waves to the solution 14 in the solution container 15, thereby misting the solution 14 in the solution container 15. The misted solution 14 passes through a channel L1 to be supplied to the back surface (upper surface) of the p-type silicon substrate 4 in the reaction container 11.

The misted solution 14 is supplied into the reaction container 11, and then, the solution 14 undergoes a reaction on the back surface of the p-type silicon substrate 4 subjected to heating under the atmospheric pressure, whereby the back surface passivation film 5 is formed on the back surface of the p-type silicon substrate 4. The solution 14 that is left unreacted in the reaction container 11 is discharged out of the reaction container 11 all the time (in a continuous manner) through a channel L2.

(Manufacturing Method)

Next, a method for manufacturing a solar cell (particularly, a method for forming the back surface passivation film 5 (the aluminum oxide film)) of the embodiment 1 will be described.

Firstly, a given impurity is introduced to a silicon substrate using a crystalline silicon as a constituent material to produce a p-type silicon substrate 4 of p-type conductivity. Then, the p-type silicon substrate 4 is placed on the heater 13 in the reaction container 11. In this time, the p-type silicon substrate 4 is placed on the heater 13 in a manner that the back surface is an upper surface and the front surface is a lower surface, and the inside of the reaction container 11 is set to the atmospheric pressure. In this way, the p-type silicon substrate 4 having a back surface and a front surface (one main surface and the other main surface) is produced.

The heater 13 heats the p-type silicon substrate 4 placed on the heater 13 until reaching a film formation temperature of the back surface passivation film 5 made of the aluminum oxide film, and maintains the p-type silicon substrate 4 at the film formation temperature.

Meanwhile, in the solution container 15, the solution 14 is misted by the mist forming apparatus 16. The misted solution 14 (the solution 14 having a small particle diameter) passes through the channel L1, undergoes the flow alignment, and is supplied into the reaction container 11. The solution 14 contains aluminum as the metal source. In this way, the solution 14 (the raw material solution) containing aluminum being a metal element is misted.

The misted solution 14 having undergone the flow alignment is supplied to the back surface of the p-type silicon substrate 4 under application of heat under the atmospheric pressure. The misted solution 14 is sprayed onto the back surface of the p-type silicon substrate 4 under application of heat, and then, the back surface passivation film 5 made of the aluminum oxide film is formed on the back surface of the p-type silicon substrate 4. As described above, the back surface passivation film 5 made of the aluminum oxide being a metal oxide film is formed on the back surface of the p-type silicon substrate 4 by spraying the misted solution 14 to the back surface of the p-type silicon substrate 4 in the atmospheric pressure (under non-vacuum).

After that, the solar cell structure shown in FIG. 1 is produced using the p-type silicon substrate 4 including the back surface passivation film 5 (the aluminum oxide film) formed thereon. In general, the back surface passivation film 5 is formed after the formation of the front surface passivation film 2 and the n-type silicon layer 3, and thereafter, the front surface electrode 1 and the back surface electrode 6 are formed. In addition, the order of film formation of the front surface passivation film 2 and the back surface passivation film 5 may be reversed.

FIG. 3 is a sectional view showing a situation of a light irradiation processing by ultraviolet light 21 of the embodiment 1. As shown in FIG. 3, the light irradiation processing in which a solar cell is irradiated for 30 seconds with ultraviolet light 21 having a wavelength of 365 nm (given light) from above of the front surface of the solar cell structure (above the front surface of the p-type silicon substrate 4) in a manner that the front surface of the p-type silicon substrate 4 is an upper surface, is performed. As described above the ultraviolet light 21 from above of the front surface of the solar cell structure is passed through a front surface passivation film 2 and an p-type silicon layer 3, and a light irradiation processing in which an interface between the p-type silicon substrate 4 and the passivation film 5 is irradiated with the ultraviolet light 21, is performed, whereby a solar cell of the embodiment 1 is completed.

As described above, the method for forming the back surface passivation film 5 (the aluminum oxide film) in the method for manufacturing a solar cell of the embodiment 1 employs the misting method (the method for forming a film by spraying the liquid solution 14 in the atmospheric pressure) to form the back surface passivation film 5 on the back surface of the p-type silicon substrate 4.

The back surface passivation film 5 made of an aluminum oxide film is not formed by supplying the vaporized raw material to the p-type silicon substrate 4 in, for example, CVD or ALD. Alternatively, in the embodiment 1, the back surface passivation film 5 is formed by spraying the misted liquid solution 14 onto the p-type silicon substrate 4. As described above, the solution 14 contains aluminum elements. Thus, the back surface passivation film 5 made of an aluminum oxide film can be formed on the back surface of the p-type silicon substrate 4, using a material that is safe and easy to handle instead of using a material such as TMA (Tri-Methyl-Aluminum) that is expensive and difficult to handle.

Moreover, the embodiment 1, which is the film forming processing in the atmospheric pressure, eliminates the need for the vacuum processing and the like, thus enabling the reduction of manufacturing cost. In addition to this, in the embodiment 1, the misted solution 14 is sprayed onto the p-type silicon substrate 4 to perform the film forming processing. Therefore, in the film forming processing, the p-type silicon substrate 4 is not damaged by irradiation with plasma or the like.

The back surface passivation film 5 is formed by the misting method at a speed of 10 to 15 nm/min, which is five or more times as fast as the speed at which the aluminum oxide film is formed by, for example, ALD method. Accordingly, the employment of the method for forming a back surface passivation film 5 of the embodiment 1 can also improve the production efficiency.

In addition to this, in the embodiment 1, a light irradiation processing in which an interface between the back surface passivation film 5 and the p-type silicon substrate 4 is irradiated with ultraviolet light 21 is performed.

FIG. 4 is a graph showing the effect of the above-mentioned light irradiation processing in the embodiment 1. FIG. 4 shows the results of the following lifetime measurement. That is, a lifetime value after the formation of a film (before the light irradiation (processing)) of the back surface passivation film 5 is measured, and thereafter, the light irradiation processing in which a solar cell is irradiated for 30 seconds with ultraviolet light 21 having a wavelength of 365 nm, is performed and the lifetime is measured again. FIG. 4 indicates an effective lifetime value which is determined by taking the lifetime value after the formation of a film (before the light irradiation) as a normalized value "1".

As shown in FIG. 4, it is found that the effective lifetime value is raised to about "2.3" after the light irradiation. As described above, it is found that the light irradiation processing extensively improves a passivation effect (a function of regulating a reduction in lifetime) of the back surface passivation film 5 produced by the method for manufacturing a solar cell in the embodiment 1.

As described above, in the method for manufacturing a solar cell of the embodiment 1, the passivation film 5 made of the aluminum oxide film is formed by spraying the misted (material) solution 14 of aluminum onto the back surface of the p-type silicon substrate 4, whereby the back surface passivation film 5 can be formed without inflicting damage to a substrate, with a high degree of production efficiency at lower manufacturing cost.

Moreover, a passivation film 5 of high film quality extensively improving an effective lifetime value can be obtained at a completion stage of a solar cell by the light irradiation processing by ultraviolet light 21 which is performed after the formation of the back surface passivation film 5.

Further, it is possible to achieve an improvement of film quality of the passivation film 5 in a relatively short time (30 seconds in an example of FIG. 4) of light irradiation by using the ultraviolet light 21 for the light irradiation processing.

In addition, while the example shown in FIG. 4 indicates an example in which the p-type silicon substrate is irradiated for 30 seconds with the ultraviolet light 21, a light irradiation time is preferably set to 1 second or more for surely achieving an improvement of the effective lifetime value of the back surface passivation film 5.

<Embodiment 2>

A baking processing at the time of forming a front surface electrode 1 and a back surface electrode 6 is an essential processing in completing the solar cell. For example, when the front surface electrode 1 and the back surface electrode 6 are formed, an electrode material containing a metal as a principal component is applied, and then a baking processing is performed.

In the embodiment 1, there has been described a method of performing a light irradiation processing after the forming the back surface passivation film 5 without considering the presence or absence of the baking processing at the time of forming an electrode. That is, the embodiment 1 is a method for manufacturing a solar cell in which generally, the following steps (1) and (2) are perforated.

(1) A p-type silicon substrate 4 is produced, a solution 14 containing aluminum is misted, and the misted solution 14 is sprayed onto the back surface of the p-type silicon substrate 4 under non-vacuum to form a passivation film 5 made of the aluminum oxide film on the back surface of the p-type silicon substrate 4.

(2) A light irradiation processing in which an interface between the back surface passivation film 5 and the p-type silicon substrate 4 is irradiated with ultraviolet light (21) is performed.

However, the above-mentioned baking processing is a substantially essential processing in forming the front surface electrode 1 and the back surface electrode 6 constituting a solar cell. That is, a process step of obtaining the solar cell structure shown in FIG. 1 includes the step of forming the front surface electrode 1 (the other electrode) and the back surface electrode 6 (one electrode) on a front surface side and a back surface side of the p-type silicon substrate 4, respectively, and this step includes the baking processing for baking the p-type silicon substrate 4 at a given baking temperature.

The embodiment 2 is a method for manufacturing a solar cell in which the light irradiation processing is performed in consideration of an influence of the baking processing at the time of forming the front surface electrode 1 and the back surface electrode 6, and the embodiment 2 is generally performed by undergoing the following steps (1), (3) and (2)'.

(1) As with the embodiment 1, a p-type silicon substrate 4 is produced, a solution 14 containing aluminum is misted, and the misted solution 14 is sprayed onto the back surface of the p-type silicon substrate 4 under non-vacuum to form a passivation film 5 made of the aluminum oxide film on the back surface of the p-type silicon substrate 4.

(3) The front surface electrode 1 and the back surface electrode 6 are formed to prepare a solar cell structure shown in FIG. 1. In doing so, the baking processing is performed at a baking temperature of 500° C. or higher in forming the front surface electrode 1 and the back surface electrode 6.

(2)' After the baking processing of the step (3), a light irradiation processing in which an interface between the p-type silicon substrate 4 and the back surface passivation film 5 is irradiated with ultraviolet light 21, is performed.

FIG. 5 is a graph showing the effect of a method for manufacturing a solar cell of the embodiment 2. FIG. 5 shows the results of the following lifetime measurement. That is, a lifetime value after the formation of a film (before the light irradiation) of the back surface passivation film 5 is measured, and then, the baking processing being a heat treatment in the atmospheric pressure in which a baking temperature is 800° C. and a baking time 10 seconds; is performed and the lifetime value after the baking (processing) is measured. Thereafter, as with the embodiment 1, the light irradiation processing in which a solar cell is irradiated for 30 seconds with ultraviolet light 21 having a wavelength of 365 nm, is performed, and the lifetime value is measured. FIG. 5 indicates an effective lifetime value which is determined by taking the lifetime value after the formation of a film (before the light irradiation) as a normalized value "1".

As shown in FIG. 5, it is found that the effective lifetime value is raised to about "2.0" after the light irradiation. That is, the effective lifetime value is lowered from "1.0" to about "0.5" immediately after the baking processing, but by subsequent light irradiation processing, the effective lifetime value is increased to "2.0" extensively exceeding "1.0" exhibited before the baking processing.

As described above, in the method for manufacturing a solar cell of the embodiment 2, the effective lifetime value to indicate the film quality of the back surface passivation film 5 formed in the step (1) is lowered temporarily by performing the baking processing (step (3)) for forming the front surface electrode 1 and the back surface electrode 6 which is substantially essential in the manufacturing method of a solar cell, but by thereafter performing the light irradiation processing of the step (2)', the film quality of the back surface passivation film 5 can be extensively improved more than the quality before performing the step (2)'.

In doing so, it is also possible to achieve an improvement of film quality of the back surface passivation film 5 even in the situation that baking processing is performed at a baking temperature of 800° C. being a baking temperature of 500° C. or higher.

<Others>

In addition, an example of using ultraviolet light 21 as light (given light) to be used for the light irradiation processing is described in the embodiment 1 and the embodiment 2 described above; however, an another kind of light may be used. For example, it is allowed to use light whose photon energy is 1.1 eV or more (a wavelength is 1100 nm or less), that is, light which a crystalline silicon in the p-type silicon substrate 4 can absorb for implementing light irradiation to an interface between the p-type silicon substrate 4 and the back surface passivation film 5 in place of the ultraviolet light 21.

It is also possible to achieve an improvement of film quality of the back surface passivation film 5 when as described above, the light irradiation processing using light which the crystalline silicon can absorb and whose photon energy is 1.1 eV or more (a wavelength is 1100 nm or less), is employed as the light irradiation processing in the method for manufacturing a solar cell of the embodiment 1 or the embodiment 2.

Further, it is possible to achieve an improvement of film quality of the back surface passivation film 5 at relatively low cost by using solar light or artificial solar light having AM of 1.5 as light to be used for the light irradiation processing in the method for manufacturing a solar cell of the embodiment 1 or the embodiment 2.

In addition, when an execution order of the baking processing (step (3)) and the light irradiation processing (step (2)') is reversed in the method for manufacturing a solar cell of the embodiment 2, it cannot be expected to achieve an extensive improvement of film quality of the back surface passivation film 5 in contrast to the embodiment 2, but it is naturally possible to achieve the effect of improving film quality of the back surface passivation film 5 compared with a conventional manufacturing method in which the light irradiation processing is not performed.

While the present invention has been shown and described in detail the foregoing description is in all aspects illustrative and not restrictive. It is therefore understood that numerous modifications and variations not exemplified can be devised without departing from the scope of the invention.

The invention claimed is:

1. A method for manufacturing a solar cell comprising the steps of:
   (a) producing a silicon substrate having a first main surface and a second main surface,
   (b) misting a solution containing a metal element, (c) spraying said misted solution onto the first main surface of said silicon substrate under non-vacuum to form a passivation film made of a metal oxide film on the first main surface of said silicon substrate, (d) producing a solar cell structure using said silicon substrate having said passivation film formed thereon, and (e) performing a light irradiation processing in which an interface between said passivation film and said first main surface of said silicon substrate is irradiated with a given light during fabrication of the solar cell, wherein said step (d) includes (d-1) a step of forming a first electrode and a second electrode on a first main surface side and a second main surface side of said silicon substrate, respectively, said step (d-1) includes a baking processing for baking at a given baking temperature, said step (e) is performed after said step (d), and said given light in said step (e) is one of:
light whose photon energy is 1.1 eV or more,
artificial solar light having an air mass of 1.5, and
ultraviolet light having a wavelength of 365 nm.

2. The method for manufacturing a solar cell according to claim 1, wherein
said metal element is aluminum, and
said metal oxide film is aluminum oxide.

3. The method for manufacturing a solar cell according to claim 1, wherein said silicon substrate is a silicon substrate in which a crystalline silicon being a constituent material has p-type conductivity.

4. The method for manufacturing a solar cell according to claim 1, wherein said given light irradiated during fabrication of the solar cell in said step (e) is the light whose photon energy is 1.1 eV or more.

5. The method for manufacturing a solar cell according to claim 1, wherein said given light irradiated during fabrication of the solar cell in said step (e) is the artificial solar light having the air mass of 1.5.

6. The method for manufacturing a solar cell according to claim 4, wherein said given light irradiated during fabrication of the solar cell in said step (e) is the ultraviolet light having the wavelength of 365 nm.

7. The method for manufacturing a solar cell according to claim 6, wherein an irradiation time of said ultraviolet light is 1 second or more.

8. The method for manufacturing a solar cell according to claim 1, wherein said given baking temperature in said step (d-1) is 500° C. or higher.

9. The method for manufacturing a solar cell according to claim 1, wherein step (e) is a constituent part of manufacturing the solar cell.

* * * * *